(12) United States Patent
Andrews et al.

(10) Patent No.: US 7,623,252 B2
(45) Date of Patent: Nov. 24, 2009

(54) METHODS, APPARATUS AND COMPUTER PROGRAM PRODUCTS FOR CONTROLLING A VOLUME OF LIQUID IN SEMICONDUCTOR PROCESSING BASED ON REFLECTED OPTICAL RADIATION

(75) Inventors: Peter Andrews, Durham, NC (US); Gerald H. Negley, Carrboro, NC (US)

(73) Assignee: Cree, Inc., Durham, NC (US)

( * ) Notice: Subject to any disclaimer, the term of this patent is extended or adjusted under 35 U.S.C. 154(b) by 415 days.

(21) Appl. No.: 11/194,183

(22) Filed: Aug. 1, 2005

(65) Prior Publication Data

US 2007/0023085 A1 Feb. 1, 2007

(51) Int. Cl.
*G01B 11/28* (2006.01)
(52) U.S. Cl. ...................................................... 356/627
(58) Field of Classification Search ................. 356/601, 356/617, 627
See application file for complete search history.

(56) References Cited

U.S. PATENT DOCUMENTS

| | | | | |
|---|---|---|---|---|
| 6,473,190 B1 * | 10/2002 | Dosmann | ...................... | 356/627 |
| 6,700,656 B1 * | 3/2004 | Chao et al. | ................... | 356/138 |
| 7,288,014 B1 * | 10/2007 | George et al. | ................. | 445/24 |
| 2003/0128371 A1 * | 7/2003 | Vaux et al. | ................... | 356/601 |
| 2004/0036856 A1 * | 2/2004 | Wittman et al. | ............... | 356/73 |
| 2004/0246501 A1 * | 12/2004 | Curtis | ........................ | 356/627 |
| 2006/0189013 A1 * | 8/2006 | Schardt et al. | ................ | 438/26 |

\* cited by examiner

*Primary Examiner*—Gregory J Toatley, Jr.
*Assistant Examiner*—Rebecca C Slomski
(74) *Attorney, Agent, or Firm*—Myers Bigel Sibley & Sajovec, P.A.

(57) ABSTRACT

A method of controlling dispensing of a liquid can include detecting a predetermined shape of a surface of a liquid in a container by reflecting optical radiation from the surface to control a volume of the liquid dispensed into the container. Related apparatus and computer program products are also disclosed.

31 Claims, 9 Drawing Sheets

METHODS, APPARATUS AND COMPUTER PROGRAM PRODUCTS FOR CONTROLLING A VOLUME OF LIQUID IN SEMICONDUCTOR PROCESSING BASED ON REFLECTED OPTICAL RADIATION

FIELD OF THE INVENTION

This invention relates to the fabrication of microelectronic devices.

BACKGROUND

It is known to provide semiconductor light emitting devices in packages that may provide protection, color selection, focusing and the like for the "device." For example, the light emitting device may be a light emitting diode.

Some of these devices can be mounted on a substrate at the bottom of a reflector cavity that is defined by sloped sidewalls of a reflector. An encapsulant material, such as liquid silicone gel, can be placed in the cavity over the device to provide a "cushion" to a lens that is mounted thereon. The cushion can allow for the lens to travel vertically (up/down) and laterally in response to heating when, for example, the device is being fabricated and/or operated.

The provided cushion may be dependent on dispensing an appropriate amount of encapsulant into the cavity. If too little encapsulant is dispensed, not enough cushion may be provided whereas if too much encapsulant is dispensed, too much cushion may occur. Lens movement is further described, for example, in United States Patent Application Pub. No. 2004/0041222.

BRIEF DESCRIPTION OF THE DRAWINGS

FIGS. 5A-7A are cross-sectional schematic representations illustrating detecting a predetermined shape of a surface of an encapsulant material according to some embodiments of the invention.

FIGS. 5B-7B are schematic representations of predetermined indicia of reflected optical radiation from a surface of an encapsulant material dispensed as shown in FIGS. 5A-7A respectively according to some embodiments of the invention.

SUMMARY

Embodiments according to the invention can provide methods, apparatus and computer program products for controlling a volume of liquid in semiconductor processing based on reflected optical radiation. Pursuant to these embodiments a method of controlling dispensing of a liquid can include detecting a predetermined shape of a surface of a liquid in a container by reflecting optical radiation from the surface to control a volume of the liquid dispensed into the container.

In some embodiments according to the invention, detecting includes impinging the optical radiation onto the surface of the liquid as the liquid is dispensed to provide reflected optical radiation from the surface. Predetermined indicia of the reflected optical radiation is detected when the surface conforms to the predetermined shape. In some embodiments according to the invention, detecting includes impinging the optical radiation onto the surface of the liquid as the liquid is dispensed to provide reflected optical radiation from the surface. The absence of predetermined indicia of the reflected optical radiation is detected when the surface conforms to the predetermined shape.

In some embodiments according to the invention, detecting includes impinging the optical radiation onto the surface of the liquid as the liquid is dispensed to create reflected optical radiation from the surface. The absence of predetermined indicia of the reflected optical radiation is detected at an optical radiation sensor as the liquid is dispensed to provide less than a volume associated with the predetermined shape of the surface. Then, the predetermined indicia of the reflected optical radiation is detected as the liquid is dispensed to provide the volume associated with the predetermined shape. In some embodiments according to the invention, the predetermined indicia is at least one point, a line, a curve, and/or a shape.

In some embodiments according to the invention, the optical radiation impinged on the surface is provided by one or more optical radiation sources. In some embodiments according to the invention, the optical radiation impinged on the surface is provided by at least one optical radiation source co-located with an optical radiation sensor or spaced apart from the optical radiation sensor.

In some embodiments according to the invention, the optical radiation impinged on the surface is provided from on-center directly above the surface co-located with an optical radiation sensor or spaced apart from the optical radiation sensor. In some embodiments according to the invention, detecting the predetermined shape includes detecting first predetermined indicia of the reflected optical radiation from the surface as the liquid is dispensed to provide less than the volume associated with the predetermined shape of the surface. A second predetermined indicia of the reflected optical radiation is detected as the liquid is dispensed to provide the volume associated with the predetermined shape of the surface.

In some embodiments according to the invention, the method further includes continuing dispensing the liquid until detecting the second predetermined indicia wherein dispensing the liquid is ceased to provide the volume associated with the predetermined shape of the surface. In some embodiments according to the invention, the method further includes detecting third predetermined indicia of the reflected optical radiation from the surface as the liquid is dispensed to provide more than the volume associated with the predetermined shape of the surface.

In some embodiments according to the invention, the method further includes indicating that the surface does not conform to the predetermined shape. In some embodiments according to the invention, the method further includes monitoring a semiconductor process based on the indication that the surface does not conform to the predetermined shape by analyzing the volume dispensed, a volume associated with the container, and/or chemistry of the liquid.

In some embodiments according to the invention, the optical radiation comprises ultraviolet light, visible light, laser light and/or infrared light. In some embodiments according to the invention, the volume of encapsulant material dispensed to prove the predetermined shape comprises about 10 microliters.

In some embodiments according to the invention, a method of controlling dispensing of a liquid for semiconductor processing includes impinging optical radiation onto a surface of a liquid encapsulant as the liquid encapsulant is dispensed into a reflector cavity to create reflected optical radiation from the surface. Dispensing of the liquid encapsulant is continued while detecting predetermined underfill indicia of the reflected optical radiation at an optical radiation sensor to provide less than a volume associated with the predetermined shape of the surface in the reflector cavity. Dispensing the liquid encapsulant is ceased if predetermined fill indicia of the reflected optical radiation associated with the predetermined shape is detected to provide the volume associated with the predetermined shape of the surface in the reflector cavity. A lens is inserted into the surface of the liquid encapsulant upon detecting the predetermined fill indicia, wherein the predetermined shape of the surface deforms in response to insertion of the lens so that the lens is suspended in the liquid encapsulant above the reflector cavity. A substrate associated with the reflector cavity is marked to indicate a defect if predetermined overfill indicia of the reflected optical radiation from the surface is detected to provide more than the volume associated with the predetermined shape of the surface.

In some embodiments according to the invention, a method of providing control for dispensing of a liquid in semiconductor processing includes providing a liquid encapsulant into a reflector cavity so that a surface of the liquid has a predetermined shape associated with a volume in the reflector cavity so that a lens inserted into the surface of the liquid encapsulant is suspended therein above the reflector cavity. An optical radiation source is placed so that optical radiation can be impinged on the surface of the liquid encapsulant to provide reflected optical radiation from the surface. An optical radiation sensor is placed so that predetermined indicia of the reflected optical radiation is provided when the surface conforms to the predetermined shape.

In some embodiments according to the invention, an apparatus for controlling dispensing of a liquid encapsulant includes a liquid encapsulant dispenser configured to dispense a volume of the liquid encapsulant into the reflector cavity predetermined to provide a surface of the liquid encapsulant having a predetermined shape. An optical radiation source is configured to impinge optical radiation onto the surface of the liquid encapsulant in the reflector cavity to provide reflected optical radiation. An optical radiation sensor is configured to detect the predetermined shape of the surface of the liquid encapsulant based on the reflected optical radiation.

In some embodiments according to the invention, an apparatus for controlling dispensing of a liquid encapsulant includes a liquid encapsulant dispenser configured to dispense a volume of the liquid encapsulant into the reflector cavity predetermined to provide a surface of the liquid encapsulant having a predetermined shape. An optical radiation source is configured to impinge optical radiation onto the surface of the liquid encapsulant in the reflector cavity to provide reflected optical radiation. An optical radiation sensor is configured to detect the predetermined shape of the surface of the liquid encapsulant based on the reflected optical radiation, wherein the optical radiation sensor is located on-center directly above the surface.

In some embodiments according to the invention, an apparatus for controlling dispensing of a liquid encapsulant includes a liquid encapsulant dispenser configured to dispense a volume of the liquid encapsulant into the reflector cavity predetermined to provide a surface of the liquid encapsulant having a predetermined shape. An optical radiation source is configured to impinge optical radiation onto the surface of the liquid encapsulant in the reflector cavity to provide reflected optical radiation. An optical radiation sensor is configured to detect the predetermined shape of the surface of the liquid encapsulant based on the reflected optical radiation, wherein the optical radiation sensor is located off-center of the surface.

In some embodiments according to the invention, a computer program product for controlling dispensing of a liquid includes a computer readable medium having computer readable program code embodied therein, the computer readable program product includes computer readable program code configured to detect a predetermined shape of a surface of a liquid in a container by reflecting optical radiation from the surface to control a volume of the liquid dispensed into the container.

DETAILED DESCRIPTION OF EMBODIMENTS ACCORDING TO THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As will be appreciated by one of skill in the art, the present invention may be embodied as methods, apparatus, and/or computer program products. Accordingly, the present invention may take the form of an entirely hardware embodiment, an entirely software embodiment or an embodiment combining software and hardware aspects. Furthermore, the present invention may take the form of a computer program product on a computer-usable storage medium having computer-usable program code embodied in the medium. Any suitable computer readable medium may be utilized including hard disks, CD-ROMs, optical storage devices, or magnetic storage devices.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Computer program code or "code" for carrying out operations according to the present invention may be written in an object oriented programming language such as JAVA®, Smalltalk or C++, JavaScript, Visual Basic, TSQL, Perl, or in various other programming languages. Software embodiments of the present invention do not depend on implementation with a particular programming language. Portions of the code may execute entirely on one or more systems utilized by an intermediary server.

The code may execute entirely on one or more servers, or it may execute partly on a server and partly on a client within a client device or as a proxy server at an intermediate point in a communications network. In the latter scenario, the client device may be connected to a server over a LAN or a WAN (e.g., an intranet), or the connection may be made through the Internet (e.g., via an Internet Service Provider). It is understood that the present invention is not TCP/IP-specific or Internet-specific. The present invention may be embodied using various protocols over various types of computer networks.

The present invention is described below with reference to block diagram and flowchart illustrations of methods, systems and computer program products according to embodiments of the invention. It is understood that each block of the illustrations, and combinations of blocks in the illustrations can be implemented by computer program instructions. These computer program instructions may be provided to a processor circuit of a general purpose computer, special purpose computer, or other programmable data processing apparatus to produce a machine, such that the instructions, which execute via the processor circuit or other programmable data processing apparatus, create means for implementing the functions specified in the block and/or flowchart block or blocks.

These computer program instructions may be stored in a computer-readable memory that can direct a computer or other programmable data processing apparatus to function in a particular manner, such that the instructions stored in the computer-readable memory produce an article of manufacture including instruction means which implement the function specified in the block diagrams and/or flowchart block or blocks.

The computer program instructions may be loaded onto the computer or other programmable data processing apparatus to cause a series of operational steps to be performed on the computer or other programmable apparatus to produce a computer implemented process such that the instructions which execute on the computer or other programmable apparatus provide steps for implementing the functions specified in the block diagrams and/or flowchart block or blocks.

Figure 1:
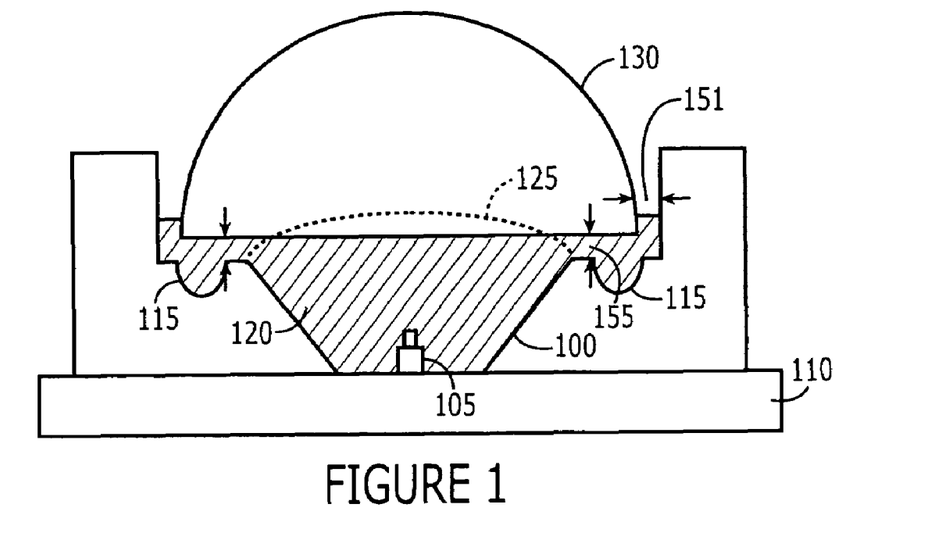
FIG. 1 is a cross-sectional schematic representation of a light emitting device according to some embodiments of the invention.

FIG. 1 is a cross-sectional schematic representation of a light emitting device according to some embodiments of the invention. In particular, a light emitting device 105 is mounted on a substrate 110 at the bottom of a reflector cavity defined by a reflector 100 having angled sidewalls. The reflector cavity is filled with an encapsulant material 120 which can be, for example, a silicone gel that can be initially dispensed into the reflector cavity so that a surface of the encapsulant material 120 has a predetermined shape 125.

During fabrication, a lens 130 can be inserted into the encapsulant material 120 so that the predetermined surface 125 of the encapsulant material 120 is deformed and displaced into a moat 115 adjacent to angled sidewalls of the reflector 100. It will be understood that the displacement of the encapsulant material 120 around the lens 130 can provide a "cushion" in both a vertical direction 155 and a lateral direction 150 that allows for the movement of the lens 130 during fabrication and operation of the light emitting device 105. As discussed above, the cushion can allow for the lens to travel vertically (up/down) and laterally in response to heating when, for example, the device is being fabricated and/or operated. Accordingly, the encapsulant material 120 can allow for the lens 130 to "float" so that the coefficient of thermal expansion of the encapsulant material 120 is allowed for.

In some embodiments according to the invention, the predetermined shape of the surface of the encapsulant material is selected so that the proper cushioning is provided to the lens 130 when inserted into the encapsulant material 120. As appreciated by the present inventors, if the volume of encapsulant material 120 dispensed into the cavity is incorrect or if the volume of the cavity itself changes due to process variations, the cushioning provided by the dispensed encapsulant material 120 to the lens 130 may be incorrect thereby affecting yields. For example, if the apparatus used to dispense the encapsulant material 120 undergoes a variation during fabrication, different amounts of encapsulant material 120 may be dispensed over time so that some devices have an appropriate amount of encapsulant material dispensed whereas others have an incorrect amount dispensed.

As further appreciated by the present inventors, the volume of the reflector cavity may also change due to variations, for example, in the shape of the reflector 100 and/or variation of the thickness of materials used to mount the light emitting device 105 and the reflector 100 on the underlying substrate 110. For example, the light emitting device 105 and the portion of the structure that provides the reflector 100 may be adhered to the substrate 100 by an adhesive whose thickness may vary so that the volume of the cavity also varies. Moreover, the volume of encapsulant material 120 and the volume of the reflector cavity may both vary over time.

As appreciated by the present inventors, in some embodiments according to the invention, variations in either or both of these factors can be compensated for by providing enough encapsulant material 120 into the reflector cavity so that a surface of the encapsulant material 120 has a predetermined shape 125 so that when the lens 130 is inserted therein, the surface of the encapsulant material 120 deforms to provide the proper amount of cushioning to the lens 130.

In some embodiments according to the invention, the predetermined shape 125 of the surface of the encapsulant material 120 can be detected by reflecting optical radiation from the surface of the encapsulant material 120, which can be used to control the volume of the encapsulant material 120 dispensed into the reflector cavity. Accordingly, the volume of the encapsulant material 120 dispensed may vary as the volume of the cavity varies.

As described herein below in greater detail, the predetermined shape of the surface can be detected by detecting predetermined indicia of optical radiation reflected from the surface. For example, in some embodiments according to the invention, an optical sensor may be positioned above the reflector cavity so that when the volume of encapsulant material 120 dispensed into the reflector cavity is such that the surface of the encapsulant material 120 conforms to the predetermined shape 125, optical radiation is reflected to the optical sensor. Furthermore, the predetermined indicia can be any indicia that can be recognized by an optical sensor and can be used to discriminate between the optical radiation reflected from the surface having the predetermined shape and a surface having a shape other than the predetermined shape. In some embodiments according to the invention, the predetermined indicia can be one or more points, a line, a curve, and/or a shape each of which can be generated by the optical radiation reflected off the surface of the encapsulant material. Furthermore, in some embodiments according to the invention, the predetermined indicia can be provided by the magnitude of the reflected optical radiation.

It will be further understood that the predetermined shape of the surface of the encapsulant material can be determined experimentally. For example, the predetermined shape may be determined by conducting a series of tests where different amounts of encapsulant material are dispensed into the same reflector cavity. For each of the tests, optical radiation may be reflected from the surface of the encapsulant material and detected using an optical sensor. A lens can then be inserted onto the encapsulant material and a test performed as to whether the proper amount of cushioning is provided. Whichever test provided the proper amount of cushioning can be designated as the desired predetermined shape that should be achieved during fabrication by recognizing, for example, the reflected pattern that was observed during the successful test. Subsequently, when the encapsulant material is dispensed into a reflector cavity, the encapsulant material may be dispensed until the same indicia (e.g., pattern) of the reflected optical radiation is detected. In some embodiments according to the invention, the volume of encapsulant material dispensed to fill the cavity is the range of microliters, such as about 10 microliters.

Figure 2:
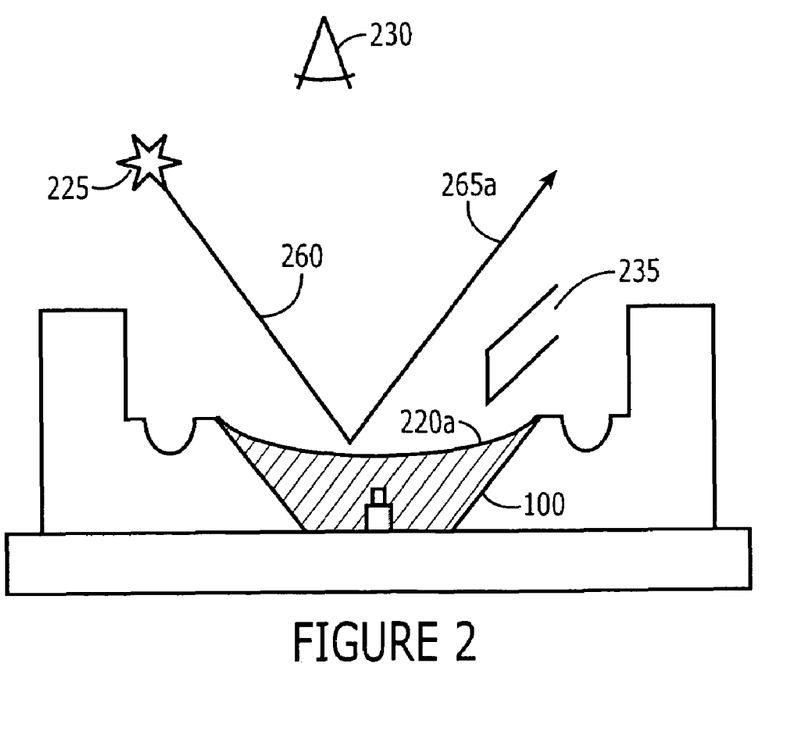
FIGS. 2-4 are cross-sectional schematic representations illustrating detecting a predetermined shape of a surface of an encapsulant material according to some embodiments of the invention.
Figure 3:
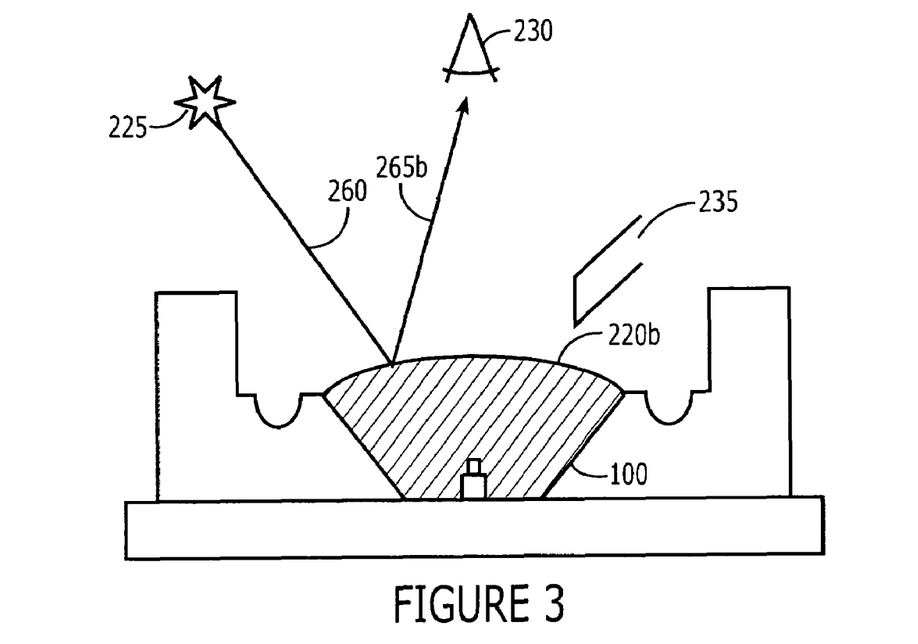
Figure 4:
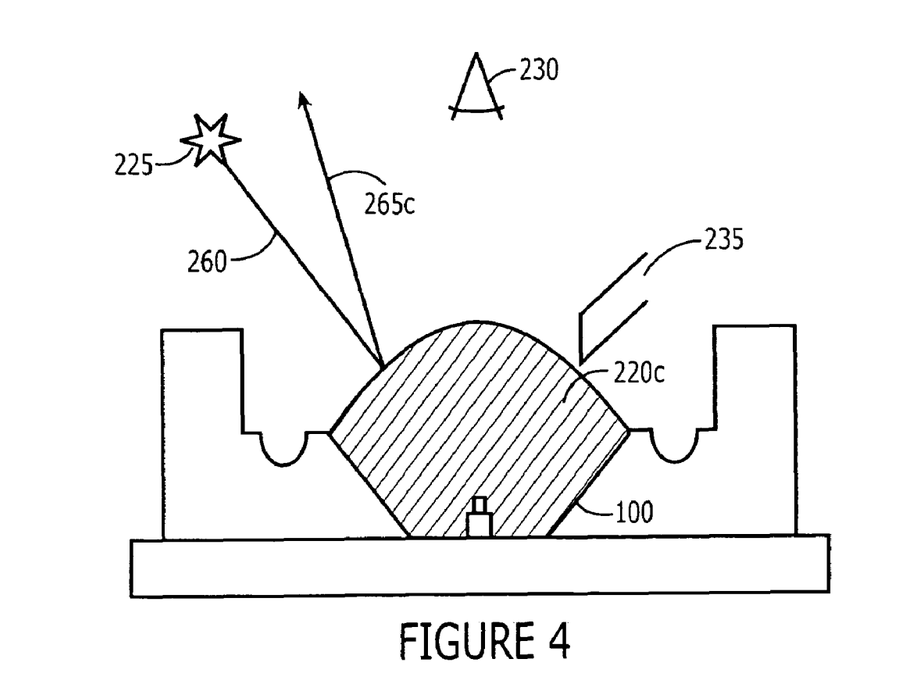

FIGS. 2-4 are cross-sectional schematic representations illustrating detecting a predetermined shape of a surface of an encapsulant material according to some embodiments of the invention. According to FIG. 2, encapsulant material 120 is dispensed into the reflector cavity by a dispenser 235 to provide a first volume of encapsulant material 120 having a surface 220a. As the encapsulant material 120 is dispensed into the reflector cavity, optical radiation 260 from an optical radiation source 225 is impinged onto the surface 220a to provide reflected optical radiation 265a. It will be understood that the encapsulant material 120 dispensed into the cavity may be a liquid.

As used herein, the term liquid includes an material that is flowable in at least one phase and which may change phase during processing. Furthermore, the term liquid includes materials having a wide range of viscosity in at least the one phase where the liquid is flowable It will be understood that the shape of the surface 220a corresponds to an underfilled situation where not enough encapsulant material 120 has been dispensed into the reflector cavity to provide the predetermined shape. Accordingly, predetermined indicia of reflected optical radiation associated with the predetermined shape of the surface representing a filled condition is not detected via the optical sensor 230. Accordingly, encapsulant material 120 is continued to be dispensed into the reflector cavity.

As shown in to FIG. 3, enough encapsulant material 120 has been dispensed into the reflector cavity to provide a surface 220b having the predetermined shape. Accordingly, the optical radiation 260 reflects from the surface 220b differently than shown in FIG. 2. Therefore, the predetermined indicia of the reflected optical radiation 265b associated with the predetermined shape of the surface 220b can be detected using the optical sensor 230. It will be understood that the volume of the encapsulant material 120 that provides the surface 220b having the predetermined shape represents a filled condition, whereupon the dispensing of encapsulant material 120 into the reflector cavity may be ceased so that when a lens is mounted thereon a proper amount of cushioning is provided thereto.

According to FIG. 4, if additional encapsulant material 120 is dispensed into the reflector cavity so that a surface 220c is formed, the optical radiation 260 reflects from the surface 220c differently so that the predetermined indicia of reflected optical radiation 265b associated with a predetermined shape of the surface 220b is not detected by the optical sensor 230. It will be understood that the situation shown in FIG. 4 can represent an overfilled condition, wherein too much encapsulant material 120 has been provided to the reflector cavity which may not provide the proper amount of cushioning to a lens mounted thereon. Accordingly, the structure shown in FIG. 4 may be marked or otherwise indicated as being defective.

It will be further understood that although the embodiments described above refer to the detection of a predetermined indicia associated with a surface of the encapsulant material having a predetermined shape in the filled condition, the other conditions (i.e., the underfilled and/or overfilled condition) can also have respective predetermined indicia associated therewith so that each of the conditions may be uniquely identified or at least distinguished from the filled condition. For example, according to FIG. 2, the underfilled condition may be recognized when the optical sensor 230 detects indicia associated with the reflected optical radiation 265a, whereas the overfilled condition illustrated in FIG. 4 can be recognized by detecting predetermined indicia associated with the reflected optical radiation 265c.

Furthermore, it will be understood that the different conditions may be monitored as the encapsulant material is dispensed such that the underfilled condition should be initially expected, followed by the filled condition, and finally followed by the overfilled condition if an error in the dispensing of the encapsulant material occurs.

Referring to FIGS. 2-4, it will be further understood that in some embodiments according to the invention, the optical radiation provided by the optical radiation reflected from the respective surface of the encapsulant material may be provided by one or more optical radiation sources. For example, in some embodiments according to the invention, two or more optical radiation sources may be used to provide predetermined indicia of reflected optical radiation. It will be further understood that the predetermined indicia associated with each of the conditions described above may be dependent upon the relative positioning of the optical radiation sources and the optical radiation sensor. For example, if the optical radiation sensor 230 were to be moved relative to the optical radiation source 225, different predetermined indicia may be needed to detect each of the conditions shown in FIGS. 2-4.

Figure 5A:
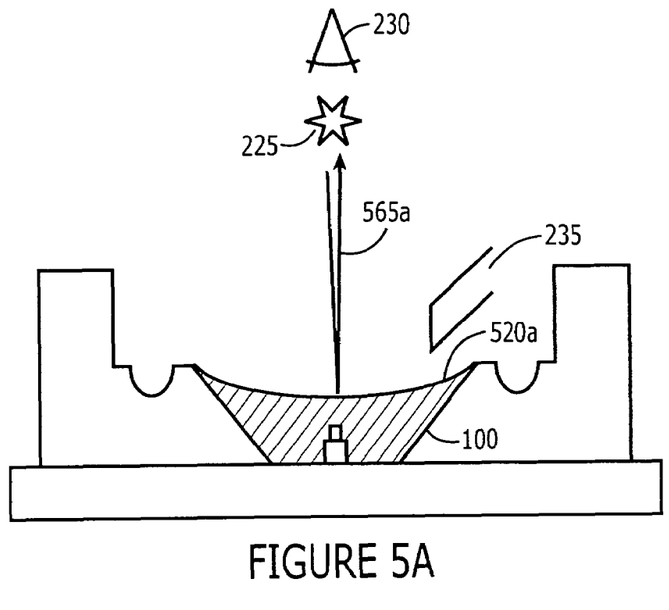
Figure 5B:
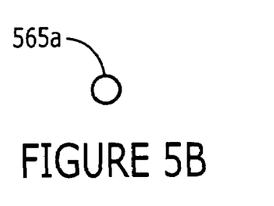

FIGS. 5A-7A are cross-sectional schematic representations illustrating detecting a predetermined shape of a surface of an encapsulant material according to some embodiments of the invention. In particular, as shown in FIGS. 5A and 5B, encapsulant material 120 is dispensed into the reflector cavity to provide an underfilled condition with a surface 520a as a first predetermined shape. As further shown in FIG. 5A, the optical radiation source 225 and the optical radiation sensor 230 are co-located directly above and on-center with the surface 520a. Accordingly, optical radiation 560 impinges upon the center of the surface 520a to provide reflected optical radiation 565 directly to the optical radiation sensor 230. The optical radiation sensor 230 can be used to detect predetermined indicia of the reflected optical radiation 565a associated with the predetermined shape of the surface 520a as shown in FIG. 5B. In particular, the predetermined indicia of the reflected optical radiation 565a can be manifested as a generally rounded image caused by the reflection from the generally concave shape of the surface 520a associated with the underfilled condition.

Figure 6A:
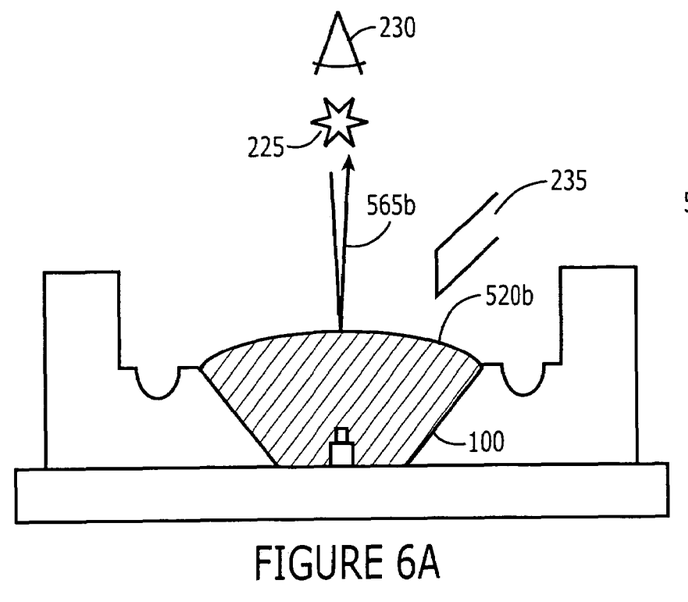
Figure 6B:
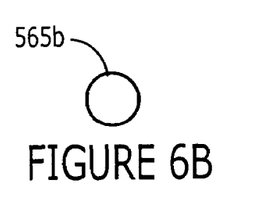

As shown in FIGS. 6A and 6B, additional encapsulant material 120 is dispensed into the reflector cavity to provide a surface 520b having a predetermined shape indicative of a filled condition. Accordingly, optical radiation 560 from the optical radiation source 225 is directly reflected back to the optical radiation sensor 230 to detect predetermined indicia of the reflected optical radiation 565b as shown in FIG. 6B. According to FIG. 6B, the predetermined indicia of the reflected optical radiation 565b can be manifested as generally round image generated by the reflection of the optical radiation 560b from the generally convex shape of the surface 520b, which can be larger than the predetermined indicia of the reflected optical radiation 565a.

Figure 7A:
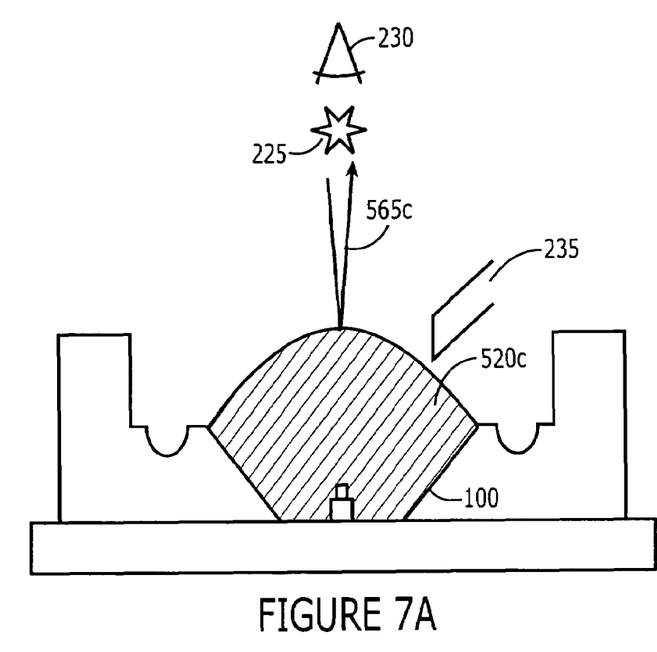
Figure 7B:
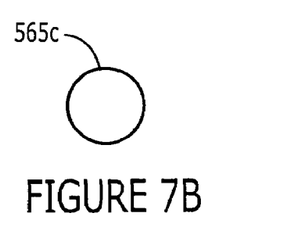

According to FIG. 7A, still additional encapsulant material is dispensed into the reflector cavity to provide a surface 520c having a predetermined shape associated therewith. Accordingly, optical radiation 560 is reflected from the surface 520c to provide reflected optical radiation 565c to the optical sensor 230. The optical sensor 230 can detect predetermined indicia associated with the reflected optical radiation 565c as shown, for example, in FIG. 7B. According to FIG. 7B, the predetermined indicia associated with the reflected optical radiation 565c can be manifested as a generally round image, which is larger than 565a and 565b shown in FIGS. 5B and 6B. The enlarged size of the predetermined indicia shown in FIG. 7B can be attributed to the increased convex shape of the surface 520 compared to the shape of the surface 520b.

As described above, in some embodiments according to the invention, the optical radiation sensor can be used to detect each of the conditions shown above in FIGS. 5A-7A (i.e., underfilled, filled, and overfilled). Furthermore, if the predetermined indicia of the reflected optical radiation 565c is detected, the device associated therewith may be marked as defective as the amount of the encapsulant material dispensed may not provide the proper cushioning to a lens inserted thereon.

Figure 8:
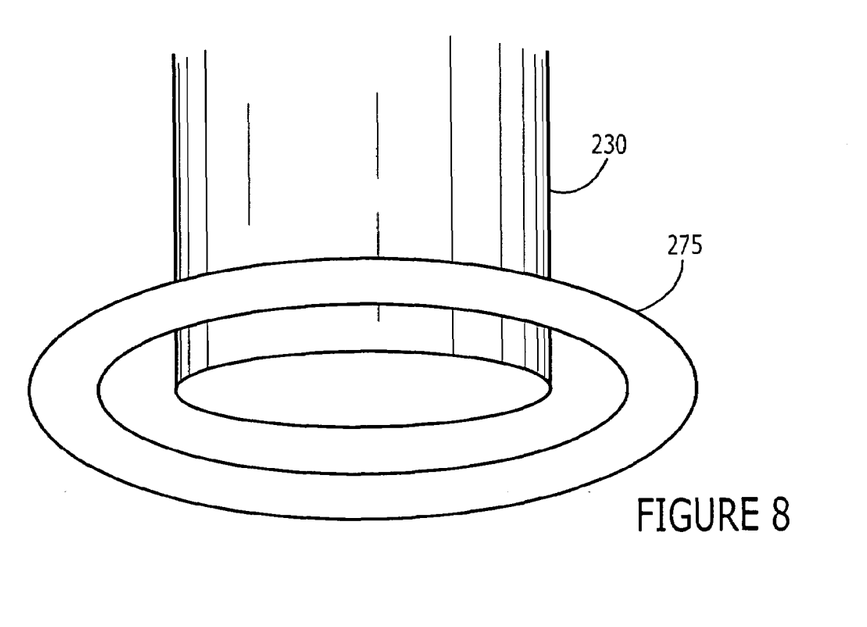
FIG. 8 is a schematic representation of an optical radiation source and a co-located optical radiation detector according to some embodiments of the invention.

FIG. 8 is a schematic representation of an optical radiation source and optical radiation sensor according to some embodiments of the invention. In particular, an optical radiation source 225 can be what is commonly referred to as a ring light positioned around the optical radiation sensor 230. The ring light can provide even light from substantially the same location occupied by the optical radiation sensor 230. Accordingly, in some embodiments according to the invention, use of a ring light with an optical radiation sensor 230 may enable the optical radiation source 225 and the optical radiation sensor 230 to be co-located as shown for example in FIGS. 5A-7A.

Figure 9:
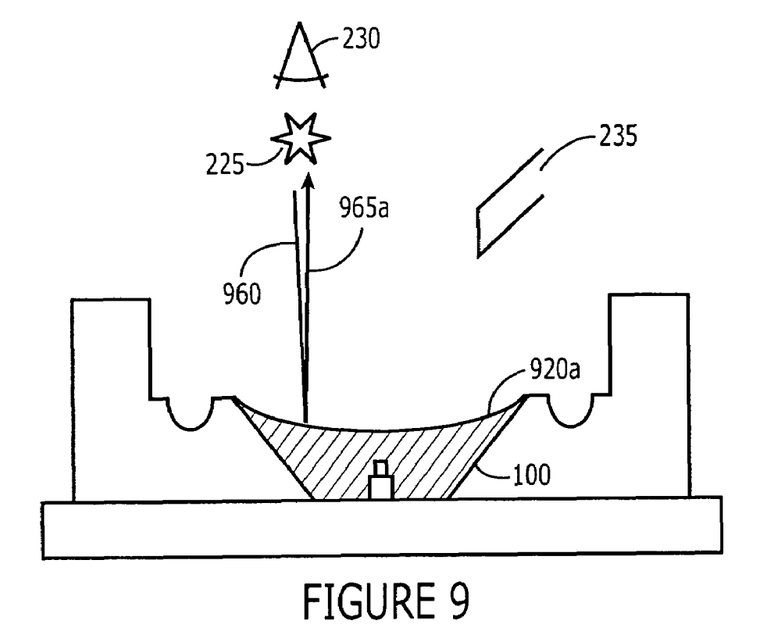
FIGS. 9-10 are cross-sectional schematic representations illustrating detecting a predetermined shape of a surface of an encapsulant material according to some embodiments of the invention.

FIGS. 9-10 are cross-sectional schematic representations illustrating detecting a predetermined shape of a surface of an encapsulant material according to some embodiments of the invention. In particular, the predetermined shape of the surface of the encapsulant material can be detected by detecting the absence of indicia otherwise associated with reflected optical radiation. As shown in FIG. 9, encapsulant material is dispensed into the reflector cavity to provide a volume of encapsulant material with a surface 920a having the predetermined shape associated therewith. As shown in FIG. 9, the optical radiation source 225 and optical radiation sensor 230 are co-located above the surface 920a. Optical radiation 960 is impinged upon the surface 920 and is reflected back to the optical sensor 230. Because of the general planar nature of the surface 920a, the predetermined indicia associated with reflected optical radiation 965a may be the type of indicia describe above with reference to FIGS. 5A-7B.

Figure 10:
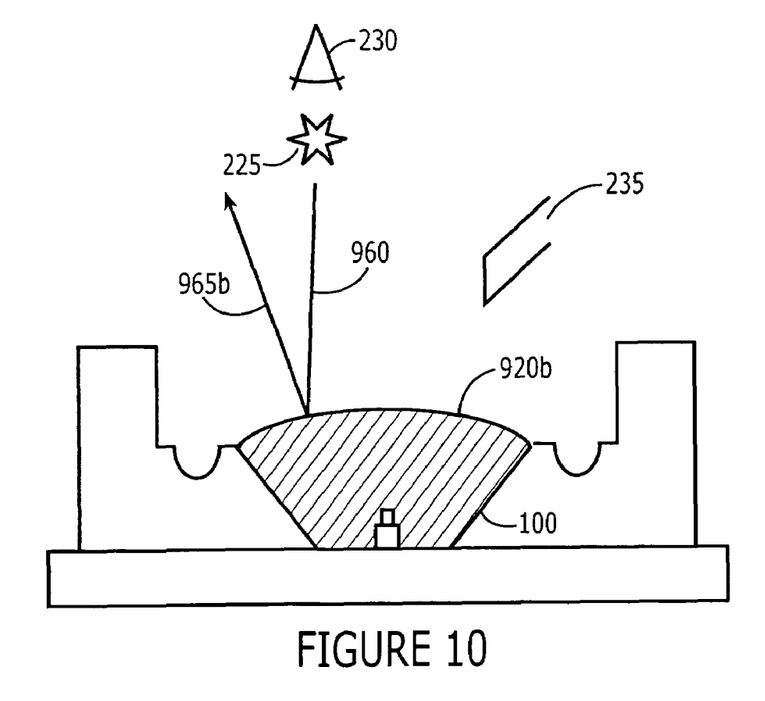

As shown in FIG. 10, as additional encapsulant material is dispensed, a volume of encapsulant material in the reflector cavity provides a surface 920b having a predetermined shape which is generally convex compared to the surface 920a in FIG. 9. Accordingly, when the surface 920b is formed, the optical radiation sensor 230 can detect the predetermined indicia associated with the reflected optical radiation 965b as an absence of the predetermined indicia associated with the reflected optical radiation 965a shown in FIG. 9. In other words, as the shape of the surface of the encapsulant material changes from 920a to 920b, the predetermined indicia associated with the surface is detected as the absence of predetermined indicia associated with the reflected optical radiation 965a, which can indicate the filled condition.

Figure 11:
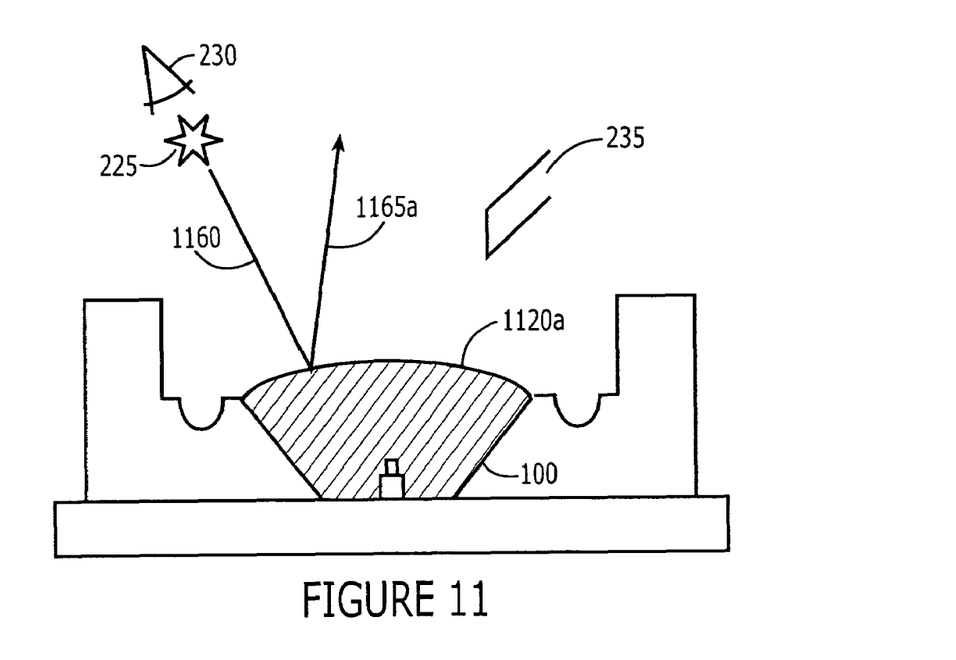
FIGS. 11-12 are cross-sectional schematic representations illustrating detecting a predetermined shape of a surface of an encapsulant material according to some embodiments of the invention.
Figure 12:
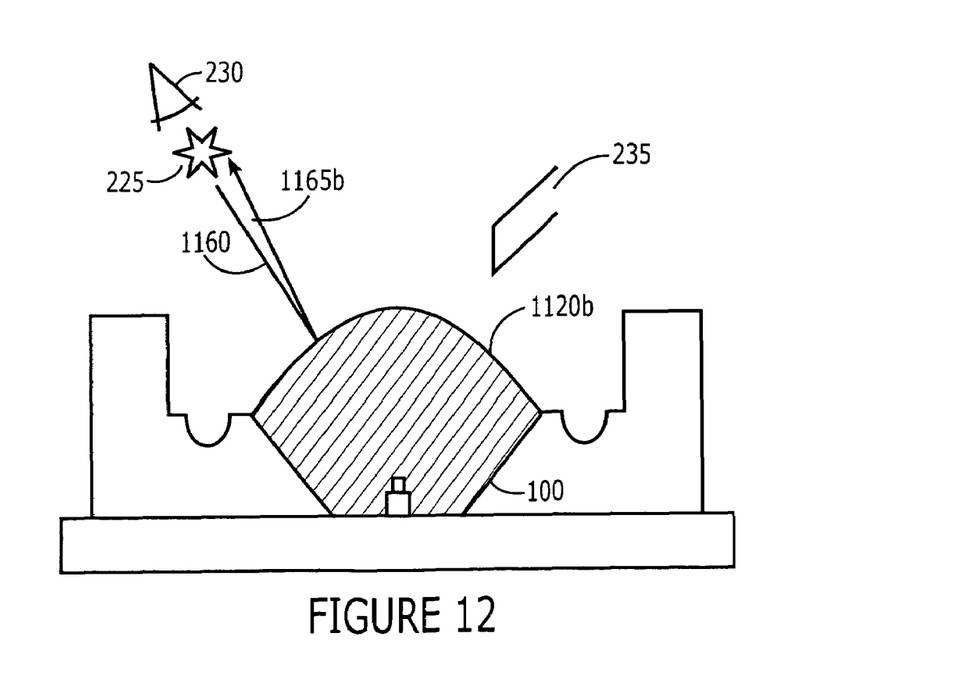

FIGS. 11-12 are cross-sectional schematic representations illustrating the formation of an encapsulant material used to collimate light produced by an LED 105. Accordingly, a surface of the encapsulant material may be formed to a predetermined shape to provide a desired collimation of light output from the light emitting device 105. In some embodiments according to the invention as illustrated in FIGS. 11 and 12, a lens may not be mounted on the device 105.

According to FIG. 11, encapsulant material 120 is dispensed into the reflector cavity to provide a volume of encapsulant material having a surface 1120a having a predetermined shape. An optical radiation source 225 and an optical radiation sensor 230 are co-located above the surface 1120a and off-center therefrom. For example, as shown in FIG. 11, the optical radiation source 225 and optical radiation sensor 230 are located to the left of the center of the surface 1120a as compared to embodiments illustrated above in reference to FIGS. 5A-7A.

As shown in FIG. 11, optical radiation 1160 is impinged upon the surface 1120a to provide reflected optical radiation 1165a. The optical radiation sensor 230 can detect predetermined indicia associated with the reflected optical radiation 1165a whereupon additional encapsulant material can be dispensed into the reflector cavity. As shown in FIG. 12, additional encapsulant material 120 is dispensed into the reflector cavity to provide a volume of encapsulant material having a surface 1120b with a predetermined shape. The optical radiation 1160 is impinged on the surface 1120b to provide reflected optical radiation 1165b. The optical radiation sensor 230 detects predetermined indicia of the reflected optical radiation 1165b to detect the predetermined shape of the surface 1120b. During subsequent processing, the encapsulant material defined by the surface 1120b can be cured.

Figure 13:
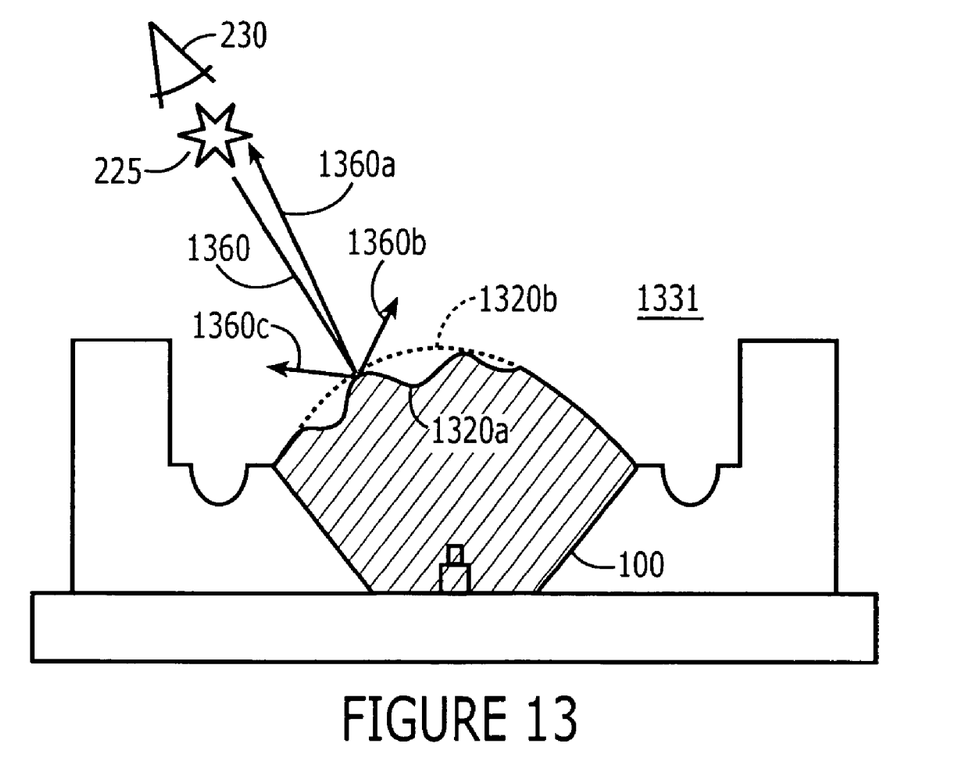
FIG. 13 is a cross-sectional schematic representation illustrating detecting a predetermined shape of a surface of an encapsulant material according to some embodiments of the invention.

As shown in FIG. 13, the curing, the surface of the encapsulant material may develop wrinkles due to, for example, uneven curing of the encapsulant material 120 where the portion nearer the surface of the encapsulant material 120 becomes hard relative to an interior portion so that wrinkles 1320a may develop thereby deforming the surface 1320b having the predetermined shape. The formation of such wrinkles may be monitored by impinging optical radiation 1360 on a portion of the surface 1320a including the wrinkles. Accordingly, the reflected optical radiation 1360b and 1360c can be provided to in response thereto. The optical radiation sensor 230 can detect the absence of predetermined indicia of reflected optical radiation 1360a which would otherwise be provided if the surface 1320b were formed without wrinkling. Accordingly, such wrinkling may indicate that the chemistry of the encapsulant material has changed and/or that the curing process has changed, whereupon these processes may be examined. The device may also be identified as defective and marked accordingly.

Figure 14:
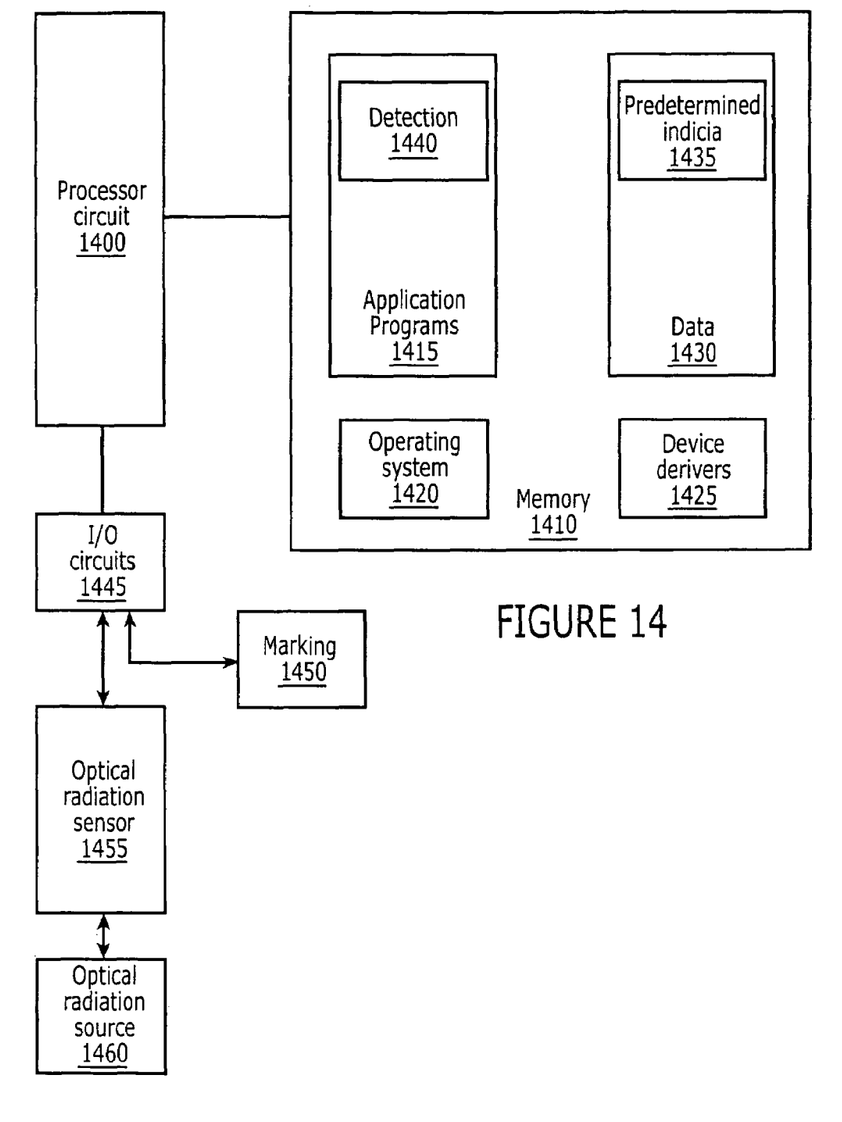
FIG. 14 is a block diagram illustrating a system including a processor circuit used to detect predetermined indicia of reflected optical radiation from a surface of an encapsulant material having a predetermined shape according to some embodiments of the invention.

FIG. 14 illustrates embodiments of a data processing system that may be used to detect predetermined indicia of a reflected optical radiation associated with predetermined shapes of encapsulant surfaces. According to FIG. 14, an exemplary data processing system 1400 may be included in devices operating in accordance with some embodiments of the invention.

As illustrated, the data processing system includes a processor circuit 1400, a memory 1410 and input/output circuits 1445. The data processing system may be incorporated in, for example, a personal computer, server, or the like. The input/output circuits 1445 can be used to transfer information between the memory 1410 and another computer system or a network using, for example, an Internet protocol (IP) connection. These components may be conventional components such as those used in many conventional data processing systems, which may be configured to operate as described herein.

In particular, the processor circuit 1400 can be any commercially available or custom microprocessor, microcontroller, digital signal processor or the like. The memory 1410 may include any memory devices containing the software and data used to implement the functionality circuits or modules used in accordance with embodiments of the present invention. The memory 1410 can include, but is not limited to, the following types of devices: ROM, PROM, EPROM, EEPROM, flash memory, SRAM, DRAM and magnetic disk. In some embodiments of the present invention, the memory 1410 may be a content addressable memory (CAM).

As further illustrated in FIG. 14, the memory 1410 may include several categories of software and data used in the data processing system: an operating system 1420; application programs 1415; input/output device drivers 1425; and data 1430. As will be appreciated by those of skill in the art, the operating system 1420 may be any operating system suitable for use with a data processing system, such as OS/2, AIX or zOS from International Business Machines Corporation, Armonk, N.Y., Windows95, Windows98, Windows2000 or WindowsXP from Microsoft Corporation, Redmond, Wash., Unix or Linux.

The input/output device drivers 1425 typically include software routines accessed through the operating system 1420 by the application programs 1415 to communicate with devices such as the input/output circuits 1445 and certain memory 1410 components. The application programs 1415 are illustrative of the programs that implement the various features of the circuits and modules according to some embodiments of the present invention. The data 1430 represents the static and dynamic data used by the application programs 1415, the operating system 1420, the input/output device drivers 1425, and other software programs that may reside in the memory 1410.

The processor circuit 1400 may control the optical radiation source 1460 and the optical radiation sensor 1455 to impinge optical radiation on the surface of the encapsulant material and to monitor the optical radiation reflected therefrom via the optical radiation sensor 1455. The processor circuit 1400 can use data provided by the optical radiation sensor 1455 to detect whether the reflected optical radiation matches predetermined indicia 1435 using a detection module 1440. For example, during setup the processor circuit 1400 may store predetermined indicia 1435 collected as described above in reference to FIG. 1 where predetermined indicia associated with a predetermined shape of a surface of the encapsulant material can be determined experimentally. It will be understood that the data 1430 can include a plurality of predetermined indicia 1435 associated with a number of different configurations which the processor circuit 1400 may monitor. In operation, the processor circuit 1400 may compare the data provided by the optical radiation sensor 1455 to predetermined indicia 1435 stored in the memory 1410. The comparison between the data provided by the optical radiation sensor 1455 and the predetermined indicia 1435 can be carried out by the detection module 1440. It will be further understood that the processor circuit 1400 may operate to initialize the predetermined indicia 1435 while conducting experimental setup described above. Furthermore, the processor circuit 1400 may control a marking apparatus 1450 that can be used to mark to indicate that a device is defective based on comparison of the data provided by the optical radiation sensor 1455 and the predetermined indicia 1435 in the memory 1410.

Figure 15:
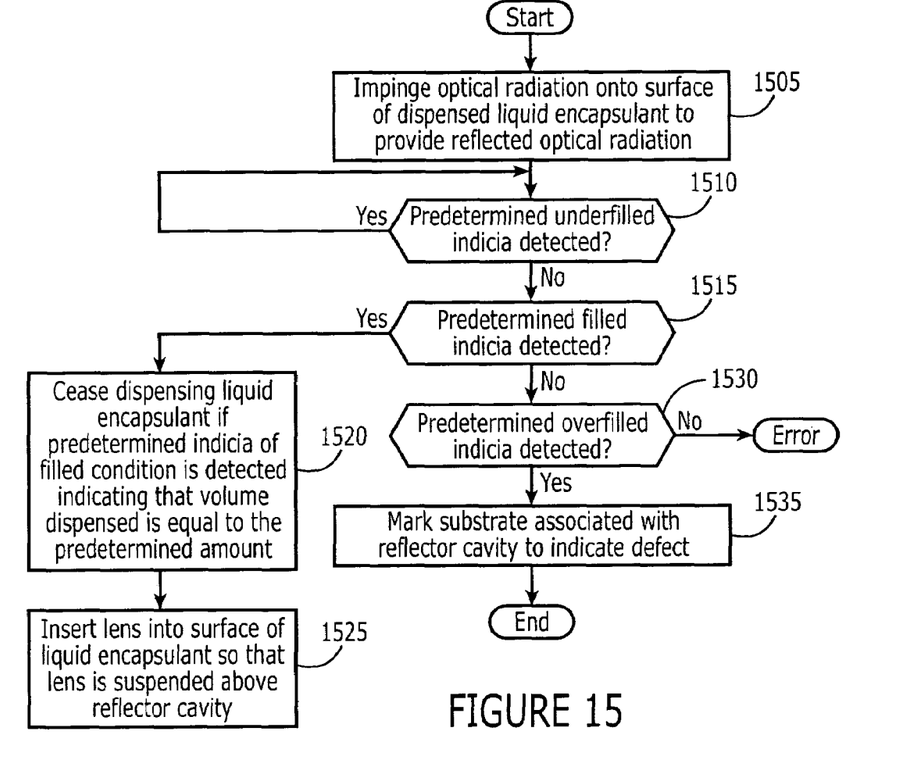
FIG. 15 is a flow chart that illustrates the fabrication of light emitting devices according to some embodiments of the invention.

FIG. 15 is a flowchart that illustrates operations according to some embodiments of the invention. According to FIG. 15, optical radiation is impinged onto the surface of encapsulant dispensed into the reflective cavity to provide reflected optical radiation therefrom (Block 1505). If predetermined indicia associated with an underfilled situation is detected (Block 1510), additional encapsulant material is dispensed into the reflector cavity. If however, a predetermined indicia of an underfilled condition is not detected, a determination is made as to whether predetermined indicia associated with a filled condition is detected (Block 1515). If filled condition is detected, dispensing of the encapsulant material is ceased (Block 1520) and a lens may be inserted into the surface of the encapsulant material so that the lens is provided with proper cushioning as described above (Block 1525).

If, however, predetermined indicia indicating a filled condition is not detected (Block 1515), a determination is made as to whether predetermined indicia associated with an overfilled condition exists (Block 1530). If no overfilled condition is detected, operations may be terminated. Alternatively, the device may be marked as defective. If, however, an overfilled condition is detected (Block 1530), the device is marked as defective (Block 1535).

As appreciated by the present inventors, if the volume of encapsulant material 120 dispensed into the cavity is incorrect or if the volume of the cavity itself changes due to process variations, the cushioning provided by the dispensed encapsulant material 120 to the lens 130 may be incorrect thereby affecting yields. For example, if the apparatus used to dispense the encapsulant material 120 undergoes a variation during fabrication, different amounts of encapsulant material 120 may be dispensed over time so that some devices have an appropriate amount of encapsulant material dispensed whereas others have an incorrect amount dispensed.

Given the benefit of the present disclosure, it will be appreciated that the embodiments according to the invention may be used in applications other than light emitting devices. For example, embodiments according to the invention may generally be used to detect a predetermined shape of a surface of a liquid, such as a reservoir.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of controlling dispensing of a liquid comprising:
    dispensing a liquid into a container;
    detecting optical radiation reflected from a surface of the liquid, comprising:
        impinging optical radiation onto the surface of the liquid as the liquid is dispensed to provide reflected optical radiation from the surface; and
        detecting presence of predetermined indicia of the reflected optical radiation; and
    controlling the volume of the liquid dispensed into the container based on the reflected radiation.

2. A method according to claim 1 wherein the predetermined indicia comprises at least one point and/or shape.

3. A method according to claim 2 wherein the optical radiation impinged on the surface comprises optical radiation provided by one or more optical radiation sources.

4. A method according to claim 1 wherein the optical radiation impinged on the surface comprises optical radiation provided by at least one optical radiation source co-located with an optical radiation sensor or spaced apart from the optical radiation sensor.

5. A method according to claim 1 wherein the optical radiation impinged on the surface comprises optical radiation provided from on-center directly above the surface co-located with an optical radiation sensor or spaced apart from the optical radiation sensor.

6. A method according to claim 1 wherein detecting presence of predetermined indicia of the reflected optical radiation comprises:
   detecting a first predetermined indicia of the reflected optical radiation from the surface as the liquid is dispensed to provide less than the volume associated with a predetermined shape of the surface; and then
   detecting a second predetermined indicia of the reflected optical radiation as the liquid is dispensed to provide the volume associated with a predetermined shape of the surface.

7. A method according to claim 6 further comprising:
   continuing dispensing the liquid until detecting the second predetermined indicia, wherein dispensing the liquid is ceased to provide the volume associated with the predetermined shape of the surface.

8. A method according to claim 6 further comprising:
   detecting a third predetermined indicia of the reflected optical radiation from the surface as the liquid is dispensed to provide more than the volume associated with the predetermined shape of the surface.

9. A method according to claim 8 further comprising:
   indicating that the surface does not conform to the predetermined shape.

10. A method according to claim 9 further comprising:
    monitoring a semiconductor process based on the indication that the surface does not conform to the predetermined shape by analyzing the volume dispensed, a volume associated with the container, and/or chemistry of the liquid.

11. A method according to claim 9 wherein indicating comprises marking a substrate associated with the container.

12. A method according to claim 1 wherein the liquid comprises a liquid encapsulant and the container comprises a reflector cavity, the method further comprising the following after the controlling step:
    inserting a lens into the surface of the liquid encapsulant after the liquid encapsulant has been dispensed into the reflector cavity, wherein a predetermined shape of the surface deforms in response to insertion of the lens so that the lens is suspended in the liquid encapsulant above the reflector cavity.

13. A method according to claim 1 wherein the optical radiation comprises ultraviolet light, visible light, laser light and/or infrared light.

14. A method of controlling dispensing of a liquid for semiconductor processing comprising:
    impinging optical radiation onto a surface of a liquid encapsulant as the liquid encapsulant is dispensed into a reflector cavity to create reflected optical radiation from the surface;
    ceasing the dispensing of the liquid encapsulant if predetermined fill indicia of the reflected optical radiation associated with a predetermined shape is detected to provide the volume associated with the predetermined shape of the surface in the reflector cavity; and
    inserting a lens into the surface of the liquid encapsulant upon detecting the predetermined fill indicia, wherein the predetermined shape of the surface deforms in response to insertion of the lens so that the lens is suspended in the liquid encapsulant above the reflector cavity.

15. A method according to claim 14 further comprising:
    monitoring a semiconductor process based on an indication that the surface does not conform to the predetermined shape by analyzing the volume dispensed, a volume associated with the container, and/or chemistry of the liquid.

16. A method according to claim 14 wherein the predetermined indicia comprises at least one point and/or shape.

17. A method according to claim 14 further comprising:
    continuing dispensing the liquid encapsulant while detecting predetermined underfill indicia of the reflected optical radiation at an optical radiation sensor to provide less than a volume associated with the predetermined shape of the surface in the reflector cavity.

18. A method according to claim 17 further comprising:
    marking a substrate associated with the reflector cavity to indicate a defect if predetermined overfill indicia of the reflected optical radiation from the surface is detected to provide more than the volume associated with the predetermined shape of the surface.

19. A method of providing control for dispensing of a liquid in semiconductor processing comprising:
    providing a liquid encapsulant into a reflector cavity so that a lens inserted into the surface of the liquid encapsulant is suspended therein above the reflector cavity;
    placing an optical radiation source so that optical radiation can be impinged on the surface of the liquid encapsulant to provide reflected optical radiation from the surface; and
    placing an optical radiation sensor so that predetermined indicia of the reflected optical radiation is detected when the surface conforms to the predetermined shape.

20. A method according to claim 19 wherein the predetermined indicia of the predetermined shape of the surface is not provided from the surface when the volume in the reflector cavity is more than or less than a volume associated with the predetermined shape of the surface of the liquid encapsulant.

21. An apparatus for controlling dispensing of a liquid encapsulant comprising:
    a liquid encapsulant dispenser configured to dispense a volume of the liquid encapsulant into a reflector cavity so as to provide a surface of the liquid encapsulant having a predetermined shape;
    an optical radiation source configured to impinge optical radiation onto the surface of the liquid encapsulant in the reflector cavity to provide reflected optical radiation; and
    an optical radiation sensor configured to detect the predetermined shape of the surface of the liquid encapsulant based on the reflected optical radiation provided from the surface of the liquid, wherein the volume of liquid dispensed by the liquid encapsulant dispenser is controlled based on the detected predetermined shape of the surface of the liquid encapsulant, and wherein the optical radiation sensor is further configured to detect a first predetermined indicia of the reflected optical radiation or an absence of a second predetermined indicia when the surface conforms to the predetermined shape.

22. An apparatus according to claim 21 wherein the optical radiation sensor is located on-center directly above the surface.

23. An apparatus according to claim 22 wherein the optical radiation source is co-located with the optical radiation sensor.

24. An apparatus according to claim 23 wherein the optical radiation source comprises a ring light coupled to the optical radiation sensor.

25. An apparatus according to claim 22 wherein the optical radiation sensor is spaced apart from the optical radiation source.

26. An apparatus according to claim 21 wherein the optical radiation sensor is located off-center of the surface.

27. An apparatus according to claim 26 wherein the optical radiation source is co-located with the optical radiation sensor.

28. An apparatus according to claim 26 wherein the optical radiation source comprises a ring light coupled to the optical radiation sensor.

29. An apparatus according to claim 26 wherein the optical radiation sensor is spaced apart from the optical radiation source.

30. An apparatus according to claim 21 wherein the optical radiation sensor is configured to receive the reflected optical radiation and provide data based thereon, the apparatus further comprising:
- a processor circuit coupled to the optical sensor and configured to process the data to detect predetermined indicia.

31. A computer program product for controlling the dispensing of a liquid into a container comprising a computer readable medium having computer readable program code embodied therein, the computer readable program product comprising:
- computer readable program code configured to detect optical radiation reflected from a surface of the liquid, comprising:
  - computer readable program code configured to impinge the optical radiation onto the surface of the liquid as the liquid is dispensed to provide reflected optical radiation from the surface; and
  - computer readable program code configured to detect presence of predetermined indicia of the reflected optical radiation; and
- computer readable program code configured to control a volume of the liquid dispensed into the container based on the reflected radiation.

* * * * *

UNITED STATES PATENT AND TRADEMARK OFFICE
CERTIFICATE OF CORRECTION

PATENT NO. : 7,623,252 B2  Page 1 of 1
APPLICATION NO. : 11/194183
DATED : November 24, 2009
INVENTOR(S) : Andrews et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 891 days.

Signed and Sealed this

Fourteenth Day of December, 2010

David J. Kappos
*Director of the United States Patent and Trademark Office*